(12) United States Patent
Lin et al.

(10) Patent No.: US 9,843,290 B2
(45) Date of Patent: Dec. 12, 2017

(54) MIXER

(71) Applicant: National Chi Nan University, Puli, Nantou (TW)

(72) Inventors: Yo-Sheng Lin, Nantou (TW); Lun-Ci Liu, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 0 days.

(21) Appl. No.: 15/340,581

(22) Filed: Nov. 1, 2016

(65) Prior Publication Data

US 2017/0093338 A1    Mar. 30, 2017

Related U.S. Application Data

(63) Continuation-in-part of application No. 14/754,886, filed on Jun. 30, 2015, now abandoned.

(30) Foreign Application Priority Data

Dec. 29, 2014  (TW) .............................. 103146075 A

(51) Int. Cl.
 *H03D 7/14* (2006.01)
(52) U.S. Cl.
 CPC ......... *H03D 7/1458* (2013.01); *H03D 7/1441* (2013.01); *H03D 2200/0019* (2013.01); *H03D 2200/0023* (2013.01); *H03D 2200/0066* (2013.01); *H03D 2200/0084* (2013.01)

(58) Field of Classification Search
 CPC .. H03D 7/1458; H03D 7/1466; H03D 7/1475; H03D 7/1483; H03D 7/1441; H03D 2200/0023; H03D 2200/0084
 USPC .......................... 327/355–360; 455/323, 326
 See application file for complete search history.

(56) References Cited

U.S. PATENT DOCUMENTS

| | | | | |
|---|---|---|---|---|
| 6,388,502 B2 * | 5/2002 | Kaneki | ................ | H03D 7/1433 327/355 |
| 6,947,720 B2 * | 9/2005 | Razavi | ................. | H03D 7/1441 330/253 |
| 7,449,934 B2 * | 11/2008 | Woo | ..................... | H03D 7/1441 327/356 |
| 8,018,267 B2 * | 9/2011 | Kang | ................... | H03D 7/1441 327/355 |
| 8,829,974 B2 * | 9/2014 | Tsai | ..................... | H03D 7/1441 327/355 |

\* cited by examiner

*Primary Examiner* — Dinh T Le
(74) *Attorney, Agent, or Firm* — Merchant & Gould P.C.

(57) ABSTRACT

A mixer includes a trans conductance unit, a gain boost unit, a mixing module and a buffer. The trans conductance unit, the gain boost unit and the mixing module cooperatively mix a differential input voltage signal pair with a differential oscillatory voltage signal pair to generate a differential mixed voltage signal pair. The buffer performs buffering on the differential mixed voltage signal pair, and has inductance that cooperates with parasitic capacitance at output terminals thereof to form an LC tank circuit that reaches resonance at a frequency of the differential mixed voltage signal pair to behave as an open circuit.

14 Claims, 8 Drawing Sheets

MIXER

CROSS-REFERENCE TO RELATED APPLICATION

This application is a continuation-in-part of U.S. patent application Ser. No. 14/754,886, filed by the applicant on Jun. 30, 2015, which claims the priority of Taiwanese Patent Application No. 103146075 filed on Dec. 29, 2014, and the entire disclosure of which is incorporated herein by reference.

FIELD

The disclosure relates to a mixer, and more particularly to a mixer that simultaneously achieves low power consumption and high conversion gain.

BACKGROUND

Referring to FIG. 1, a conventional Gilbert mixer includes a transconductance unit 12, a mixer unit 11, a first resistor (R11) and a second resistor (R12).

The trans conductance unit 12 receives a differential input voltage signal pair of intermediate frequency, and converts the differential input voltage signal pair into a differential input current signal pair.

The mixer unit 11 receives a differential oscillatory voltage signal pair, and is coupled to the trans conductance unit 12 for receiving the differential input current signal pair therefrom. The mixer unit 11 mixes the differential oscillatory voltage signal pair and the differential input current signal pair to generate a differential mixed current signal pair that includes a first mixed current signal (IRF1) and a second mixed current signal (IRF2) and that is of radio frequency.

The first resistor (R11) has a first terminal that receives a supply voltage (VDD1), and a second terminal that is coupled to the mixer unit 11 for receiving the first mixed current signal (IRF1) therefrom and that outputs a first mixed voltage signal (VRF1).

The second resistor (R12) has a first terminal that receives the supply voltage (VDD1), and a second terminal that is coupled to the mixer unit 11 for receiving the second mixed current signal (IRF2) therefrom and that outputs a second mixed voltage signal (VRF2). The first and second mixed voltage signals (VRF1, VRF2) constitute a differential mixed voltage signal pair.

When the conventional Gilbert mixer has a relatively high conversion gain, the first and second resistors (R11, R12) consume relatively high power. So, the conventional Gilbert mixer is unable to simultaneously achieve low power consumption and high conversion gain.

SUMMARY

Therefore, an object of the disclosure is to provide a mixer that can alleviate the drawback of the prior art.

According to the disclosure, the mixer includes a trans conductance unit, a gain boost unit, a mixing module and a buffer.

The transconductance unit receives a differential input voltage signal pair, and converts the differential input voltage signal pair into a differential input current signal pair that includes a first input current signal and a second input current signal.

The gain boost unit is coupled to the trans conductance unit, and generates a first auxiliary current signal that constitutes a portion of the first input current signal, and a second auxiliary current signal that constitutes a portion of the second input current signal.

The mixing module receives a differential oscillatory voltage signal pair, and is coupled to the trans conductance unit for receiving a remaining portion of the first input current signal and a remaining portion of the second input current signal therefrom. The mixing module mixes the remaining portions of the first and second input current signals with the differential oscillatory voltage signal pair to generate a differential mixed voltage signal pair.

The buffer is coupled to the mixing module for receiving the differential mixed voltage signal pair therefrom, has a pair of buffer output terminals, performs buffering on the differential mixed voltage signal pair to generate at the buffer output terminals a differential buffered voltage signal pair, and is configured to have inductance that cooperates with parasitic capacitance at the buffer output terminals to form an LC tank circuit that reaches resonance at a frequency of the differential buffered voltage signal pair to behave as an open circuit.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
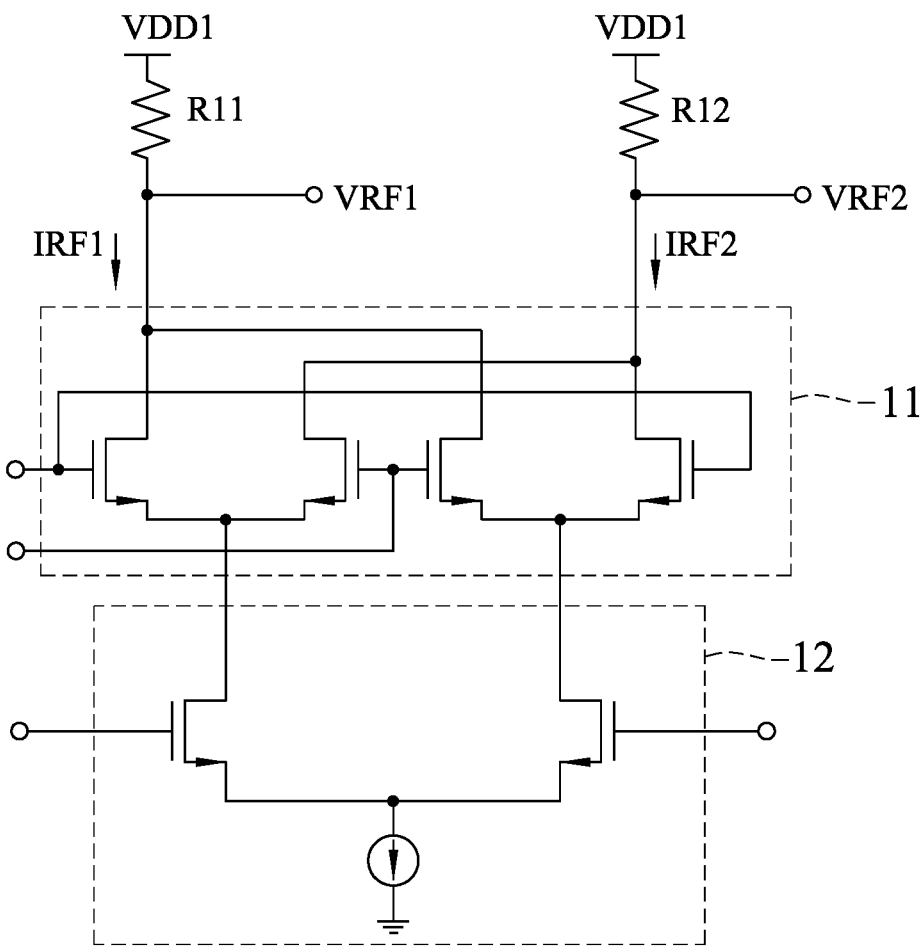
FIG. 1 is a block diagram illustrating a conventional Gilbert mixer.
Figure 2A:
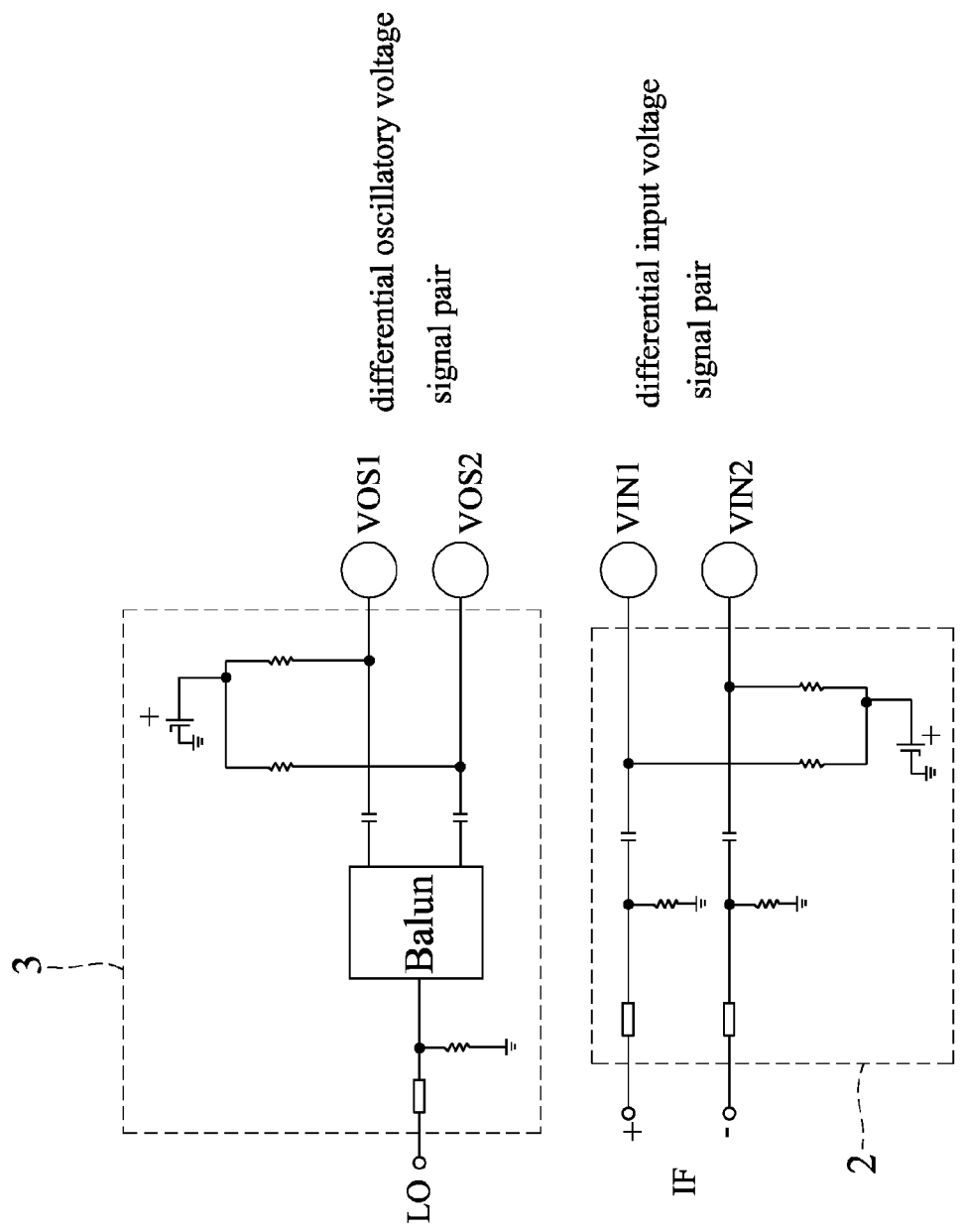
FIGS. 2A and 2B are circuit block diagrams illustrating an embodiment of a mixer according to the disclosure.
Figure 2B:
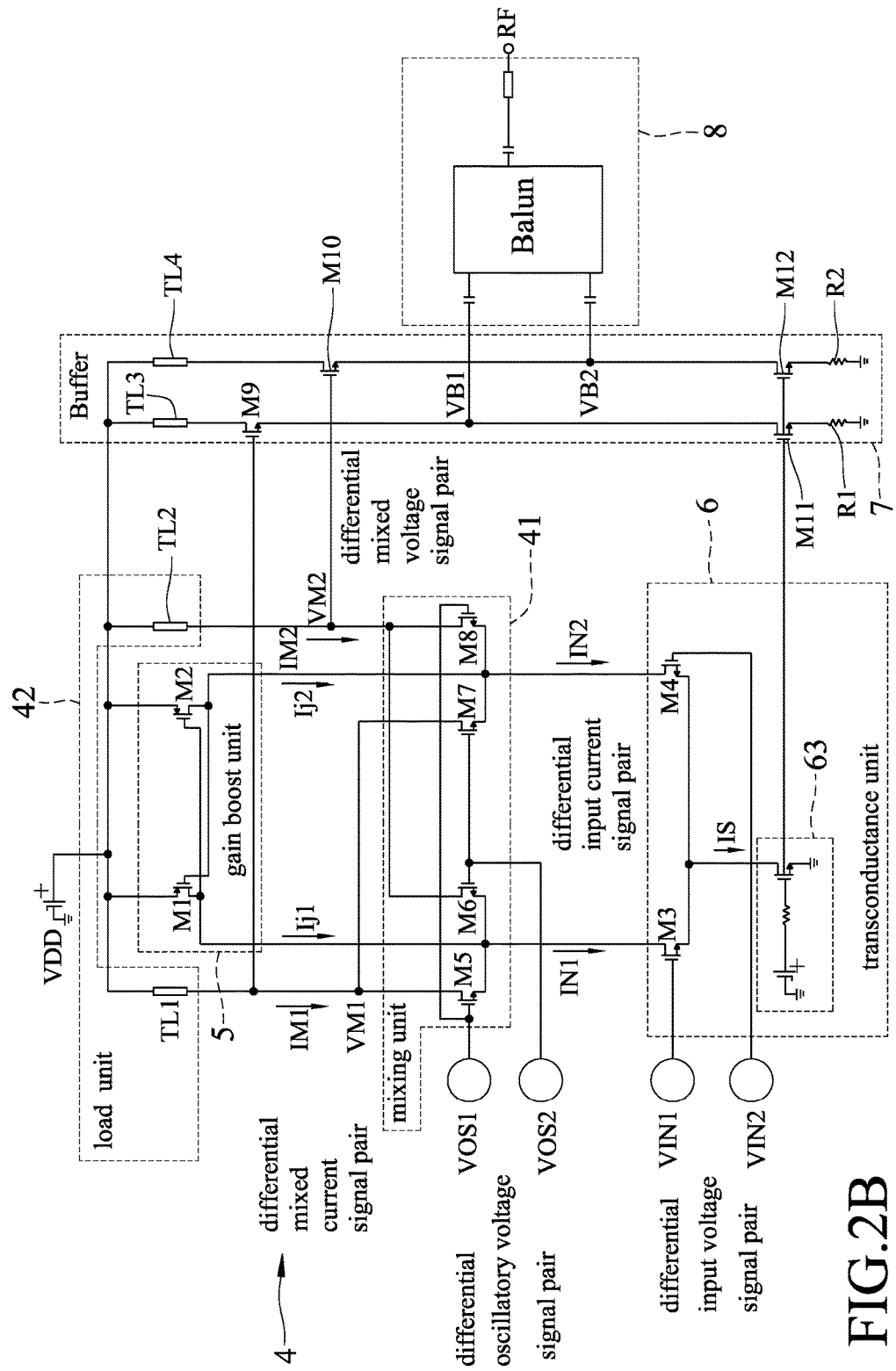

Referring to FIGS. 2A and 2B, an embodiment of a mixer according to the disclosure includes a filter 2, a single-ended to differential converter 3, a mixing module 4, a gain boost unit 5, a transconductance unit 6, a buffer 7 and a differential to single-ended converter 8.

The filter 2 receives a differential to-be-shifted voltage signal pair (IF) of, for example, intermediate frequency, and filters the differential to-be-shifted voltage signal pair (IF) to generate a differential input voltage signal pair that includes a first input voltage signal (VIN1) and a second input voltage signal (VIN2). FIG. 2A shows an exemplary implementation of the filter 2, but the disclosure is not limited thereto.

The single-ended to differential converter 3 receives a single-ended oscillatory voltage signal (LO), and converts the single-ended oscillatory voltage signal (LO) into a differential oscillatory voltage signal pair that includes a first oscillatory voltage signal (VOS1) and a second oscillatory voltage signal (VOS2). FIG. 2A shows an exemplary implementation of the single-ended to differential converter 3, but the disclosure is not limited thereto.

The transconductance unit 6 is coupled to the filter 2 for receiving the differential input voltage signal pair therefrom, and converts the differential input voltage signal pair into a differential input current signal pair that includes a first input current signal (IN1) and a second input current signal (IN2).

The gain boost unit 5 is coupled to the trans conductance unit 6, and generates a first auxiliary current signal (Ij1) that constitutes a portion of the first input current signal (IN1), and a second auxiliary current signal (Ij2) that constitutes a portion of the second input current signal (IN2).

The mixing module 4 is coupled to the single-ended to differential converter 3 for receiving the differential oscillatory voltage signal pair therefrom, and is coupled to the transconductance unit 6 for receiving a remaining portion of the first input current signal (IN1) and a remaining portion of the second input current signal (IN2) therefrom. The mixing module 4 mixes the remaining portions of the first and second input current signals (IN1, IN2) with the differential oscillatory voltage signal pair to generate a differential mixed voltage signal pair that includes a first mixed voltage signal (VM1) and a second mixed voltage signal (VM2) and that is of, for example, radio frequency.

The buffer 7 is coupled to the mixing module 4 for receiving the differential mixed voltage signal pair therefrom, has a pair of buffer output terminals, and performs buffering on the differential mixed voltage signal pair to generate at the buffer output terminals a differential buffered voltage signal pair that includes a first buffered voltage signal (VB1) and a second buffered voltage signal (VB2). The buffer 7 is configured to have inductance that cooperates with parasitic capacitance at the buffer output terminals thereof to form an LC tank circuit that reaches resonance to behave as an open circuit at a frequency of the differential buffered voltage signal pair.

The differential to single-ended converter 8 is coupled to the buffer 7 for receiving the differential buffered voltage signal pair therefrom, and converts the differential buffered voltage signal pair into a single-ended buffered voltage signal (RF). FIG. 2B shows an exemplary implementation of the differential to single-ended converter 8 that includes a balun having two input terminals and an output terminal, and three capacitors respectively coupled to the input and output terminals of the balun, but the disclosure is not limited thereto. It is noted that, an input impedance seen into the balun from each of the input terminals thereof is typically approximately 50 ohms.

In this embodiment, the differential to-be-shifted voltage signal pair (IF) has a frequency of 0.1 GHz, the single-ended oscillatory voltage signal (LO) has a frequency of 78.9 GHz, and the single-ended buffered voltage signal (RF) has a frequency of 79 GHz.

In this embodiment, the gain boost unit 5 includes a first transistor (M1) and a second transistor (M2). The first transistor (M1) has a first terminal that receives a supply voltage (VDD), a second terminal that outputs the first auxiliary current signal (Ij1), and a control terminal. The second transistor (M2) has a first terminal that receives the supply voltage (VDD), a second terminal that is coupled to the control terminal of the first transistor (M1) and that outputs the second auxiliary current signal (Ij2), and a control terminal that is coupled to the second terminal of the first transistor (M1).

In this embodiment, the transconductance unit 6 includes a third transistor (M3), a fourth transistor (M4) and a current source 63. The third transistor (M3) has a first terminal that is coupled to the second terminal of the first transistor (M1) and that outputs the first input current signal (IN1), a second terminal, and a control terminal that is coupled to the filter 2 for receiving the first input voltage signal (VIN1) therefrom. The fourth transistor (M4) has a first terminal that is coupled to the second terminal of the second transistor (M2) and that outputs the second input current signal (IN2), a second terminal that is coupled to the second terminal of the third transistor (M3), and a control terminal that is coupled to the filter 2 for receiving the second input voltage signal (VIN2) therefrom. The current source 63 is coupled to the second terminal of the third transistor (M3) for providing a bias current (IS) thereto, and provides a bias voltage.

In this embodiment, the mixing module 4 includes a mixing unit 41 and a load unit 42. The mixing unit 41 is coupled to the single-ended to differential converter 3 for receiving the differential oscillatory voltage signal pair therefrom, and is coupled to the first terminals of the third and fourth transistors (M3, M4) for receiving the remaining portions of the first and second input current signals (IN1, IN2) respectively therefrom. The mixing unit 41 mixes the remaining portions of the first and second input current signals (IN1, IN2) with the differential oscillatory voltage signal pair to generate a differential mixed current signal pair that includes a first mixed current signal (IM1) and a second mixed current signal (IM2). The load unit 42 is coupled to the mixing unit 41 for receiving the differential mixed current signal pair therefrom, and converts the differential mixed current signal pair into the differential mixed voltage signal pair.

The mixing unit 41 includes a fifth transistor (M5), a sixth transistor (M6), a seventh transistor (M7) and an eighth transistor (M8).

The fifth transistor (M5) has a first terminal, a second terminal that is coupled to the first terminal of the third transistor (M3), and a control terminal that is coupled to the single-ended to differential converter 3 for receiving the first oscillatory voltage signal (VOS1) therefrom.

The sixth transistor (M6) has a first terminal, a second terminal that is coupled to the second terminal of the fifth transistor (M5), and a control terminal that is coupled to the single-ended to differential converter 3 for receiving the second oscillatory voltage signal (VOS2) therefrom. The sixth transistor (M6) cooperates with the fifth transistor (M5) to receive the remaining portion of the first input current signal (IN1) from the third transistor (M3).

The seventh transistor (M7) has a first terminal that is coupled to the first terminal of the fifth transistor (M5), a second terminal that is coupled to the first terminal of the fourth transistor (M4), and a control terminal that is coupled to the control terminal of the sixth transistor (M6) and that receives the second oscillatory voltage signal (VOS2). The seventh transistor (M7) cooperates with the fifth transistor (M5) to output the first mixed current signal (IM1).

The eighth transistor (M8) has a first terminal that is coupled to the first terminal of the sixth transistor (M6), a second terminal that is coupled to the second terminal of the seventh transistor (M7), and a control terminal that is coupled to the control terminal of the fifth transistor (M5) and that receives the first oscillatory voltage signal (VOS1). The eighth transistor (M8) cooperates with the seventh transistor (M7) to receive the remaining portion of the second input current signal (IN2) from the fourth transistor (M4), and cooperates with the sixth transistor (M6) to output the second mixed current signal (IM2).

The load unit 42 includes a first inductive transmission line (TL1) and a second inductive transmission line (TL2).

The first inductive transmission line (TL1) has a first terminal that receives the supply voltage (VDD), and a second terminal that is coupled to the first terminal of the fifth transistor (M5) for receiving the first mixed current signal (IM1) therefrom and that outputs the first mixed voltage signal (VM1).

The second inductive transmission line (TL2) has a first terminal that receives the supply voltage (VDD), and a second terminal that is coupled to the first terminal of the sixth transistor (M6) for receiving the second mixed current signal (IM2) therefrom and that outputs the second mixed voltage signal (VM2).

In this embodiment, the buffer 7 includes a ninth transistor (M9), a tenth transistor (M10), an eleventh transistor (M11), a twelfth transistor (M12), a third inductive transmission line (TL3), a fourth inductive transmission line (TL4), a first resistor (R1) and a second resistor (R2), and the buffer output terminals include a first buffer output terminal and a second buffer output terminal.

The ninth transistor (M9) has a control terminal that is coupled to the second terminal of the first inductive transmission line (TL1) of the load unit 42 of the mixing module 4 for receiving the first mixed voltage signal (VM1) therefrom, a first terminal, and a second terminal that serves as the first buffer output terminal at which the first buffered voltage signal (VB1) is outputted.

The tenth transistor (M10) has a control terminal that is coupled to the second terminal of the second inductive transmission line (TL2) of the load unit 42 of the mixing module 4 for receiving the second mixed voltage signal (VM2) therefrom, a first terminal, and a second terminal that serves as the second buffer output terminal at which the second buffered voltage signal (VB2) is outputted.

The eleventh transistor (M11) has a first terminal that is coupled to the second terminal of the ninth transistor (M9), a second terminal, and a control terminal that is coupled to the current source 63 for receiving the bias voltage therefrom.

The twelfth transistor (M12) has a first terminal that is coupled to the second terminal of the tenth transistor (M10), a second terminal, and a control terminal that is coupled to the control terminal of the eleventh transistor (M11) and that receives the bias voltage.

The third inductive transmission line (TL3) has a first terminal that receives the supply voltage (VDD), and a second terminal that is coupled to the first terminal of the ninth transistor (M9). The third inductive transmission line (TL3) has an inductance that cooperates with parasitic capacitance at the first buffer output terminal to form a first LC tank circuit that reaches resonance at a frequency of the first buffered voltage signal (VB1) to behave as an open circuit.

The fourth inductive transmission line (TL4) has a first terminal that receives the supply voltage (VDD), and a second terminal that is coupled to the first terminal of the tenth transistor (M10). The fourth inductive transmission line (TL4) has an inductance that cooperates with parasitic capacitance at the second buffer output terminal to form a second LC tank circuit that reaches resonance at a frequency of the second buffered voltage signal (VB2) to behave as an open circuit.

The first resistor (R1) is coupled between the second terminal of the eleventh transistor (M11) and ground. The second resistor (R2) is coupled between the second terminal of the twelfth transistor (M12) and ground.

In this embodiment, each of the first and second transistors (M1, M2) is, for example, a P-type metal oxide semiconductor field effect transistor, and each of the third to twelfth transistors (M3~M12) is, for example, an N-type metal oxide semiconductor field effect transistor. In such a case, the parasitic capacitance at the first buffer output terminal refers to parasitic capacitance between source and drain terminals of each of the ninth and eleventh transistors (M9, M11), and the parasitic capacitance at the second buffer output terminal refers to parasitic capacitance between source and drain terminals of each of the tenth and twelfth transistors (M10, M12). A voltage gain (VG) of the buffer 7 may be derived as follows.

$$VG = \frac{Z_L}{\frac{1}{g_{m9,10}} + Z_L}, \text{ and} \quad (1)$$

$$Z_L = Z_{out1} \| Z_{out2}$$
$$= \left[R_{1,2} + \left(\frac{1}{sC_{ds11,12}} \| R_{ds11,12}\right)(1 + g_{m11,12}R_{1,2})\right] \|$$
$$\left[sL_{3,4} + \left(\frac{1}{sC_{ds9,10}} \| R_{ds9,10}\right)(1 + g_{m9,10} \cdot sL_{3,4})\right]$$
$$\approx \left[R_{1,2} + \frac{1}{sC_{ds11,12}} \cdot g_{m11,12}R_{1,2}\right] \| \left[sL_{3,4} + \frac{1}{sC_{ds9,10}} \cdot g_{m9,10} \cdot sL_{3,4}\right]$$
(at radio frequency)
$$= \left[R_{1,2} + \frac{1}{s[C_{ds11,12}/(g_{m11,12}R_{1,2})]}\right] \| \left[\frac{L_{3,4}g_{m9,10}}{C_{ds9,10}} + sL_{3,4}\right],$$

where $Z_L$ represents an output impedance seen into the buffer 7 from each of the first and second buffer output terminals, $g_{m9,10}$ represents a transconductance of each of the ninth and tenth transistors (M9, M10), $g_{m11,12}$ represents a transconductance of each of the eleventh and twelfth transistors (M11, M12), $Z_{out1}$ represents an impedance seen into each of the eleventh and twelfth transistors (M11, M12) from the corresponding one of the first and second buffer output terminals, $Z_{out2}$ represents an impedance seen into each of the ninth and tenth transistors (M9, M10) from the corresponding one of the first and second buffer output terminals, $R_{1,2}$ represents a resistance of each of the first and second resistors (R1, R2), $C_{ds11,12}$ and $R_{ds11,12}$ respectively represent a parasitic capacitance and a parasitic resistance between the source and drain terminals of each of the eleventh and twelfth transistors (M11, M12), $C_{ds9,10}$ and $R_{ds9,10}$ respectively represent a parasitic capacitance and a parasitic resistance between the source and drain terminals of each of the ninth and tenth transistors (M9, M10), and $L_{3,4}$ represents an inductance of each of the third and fourth inductive transmission lines (TL3, TL4).

In this embodiment, the buffer 7 is configured to satisfy a relationship (2), and satisfy a relationship (3) at an RF operation frequency (e.g., the frequency of the differential buffered voltage signal pair, which is 79 GHz in this embodiment).

$$R_{1,2} \approx \frac{L_{3,4}g_{m9,10}}{C_{ds9,10}} \quad (2)$$

$$\frac{1}{s[C_{ds11,12}/(g_{m11,12}R_{1,2})]} \approx -sL_{3,4} \quad (3)$$

For instance, difference between the two sides of each of the relationships (2) and (3) is less than 10% (i.e., a ratio of the left side to the right side ranges between 0.9 and 1.1). The meaning of the relationship (3) is that the effect of the capacitance $C_{ds11,12}/(g_{m11,12}R_{1,2})$ can be cancelled by the inductance $L_{3,4}$ at the RF operation frequency. That is, the parallel of $C_{ds11,12}/(g_{m11,12}R_{1,2})$ and $L_{3,4}$ behaves as an open circuit at resonance. Accordingly, the relationship (1) may be further simplified as $$Z_L \approx \left(R_{1,2} \| \frac{L_{3,4}g_{m9,10}}{C_{ds9,10}}\right) + \frac{C_{ds9,10}L_{3,4}g_{m11,12}R_{1,2}}{C_{ds11,12}(R_{1,2}C_{ds9,10} + L_{3,4}g_{m9,10})},$$

which is far larger than $(1/g_{m9,10})$, and the voltage gain (VG) is thus approximately 1.

A conversion gain (CG) of the mixer (i.e., a ratio of a difference of the differential mixed voltage signal pair to a difference of the differential input voltage signal pair) can be expressed by the following equation:

$$CG = \frac{2}{\pi} \frac{G_{m,LO}}{(G_{m,LO} - G_{m1,2})} G_{m3,4} \times \omega_{RF} \times L,$$

where $G_{m,LO}$ denotes an equivalent transconductance seen into the mixing unit 41 from the second terminal of each of the fifth and seventh transistors (M5, M7), $Gm_{1,2}$ denotes a transconductance of each of the first and second transistors (M1, M2), $G_{m3,4}$ denotes a transconductance of each of the third and fourth transistors (M3, M4), $\omega_{RF}$ denotes an angular frequency of the differential mixed voltage signal pair, and L denotes an inductance of each of the first and second inductive transmission lines (TL1, TL2), whose equivalent impedance is typically approximately 400 ohms. It is noted that, when the differential to single-ended converter 8 is directly coupled to the mixing module 4 and receives the differential mixed voltage signal pair therefrom, the low input impedance of the balun may result in a low conversion gain of the entire mixer since an equivalent output impedance in the equation above would be derived as $|j\omega L\|50\Omega|$ instead of L, and would approximate to $50\Omega$ since $\omega L$ is approximately $400\Omega$ at the frequency of the differential buffered voltage signal pair. Accordingly, the buffer 7 prevents the conversion gain (CG) from being pulled down by the balun of the differential to single-ended converter 8. In addition, it is known from the equation that the gain boost unit 5 can boost the conversion gain (CG), and that the conversion gain (CG) increases with increase of the trans conductance $(Gm_{1,2})$.

Moreover, power consumption of the first and second inductive transmission lines (TL1, TL2) and thus power consumption of the mixer can be decreased by increasing the first and second auxiliary current signals (Ij1, Ij2).

Figure 3:
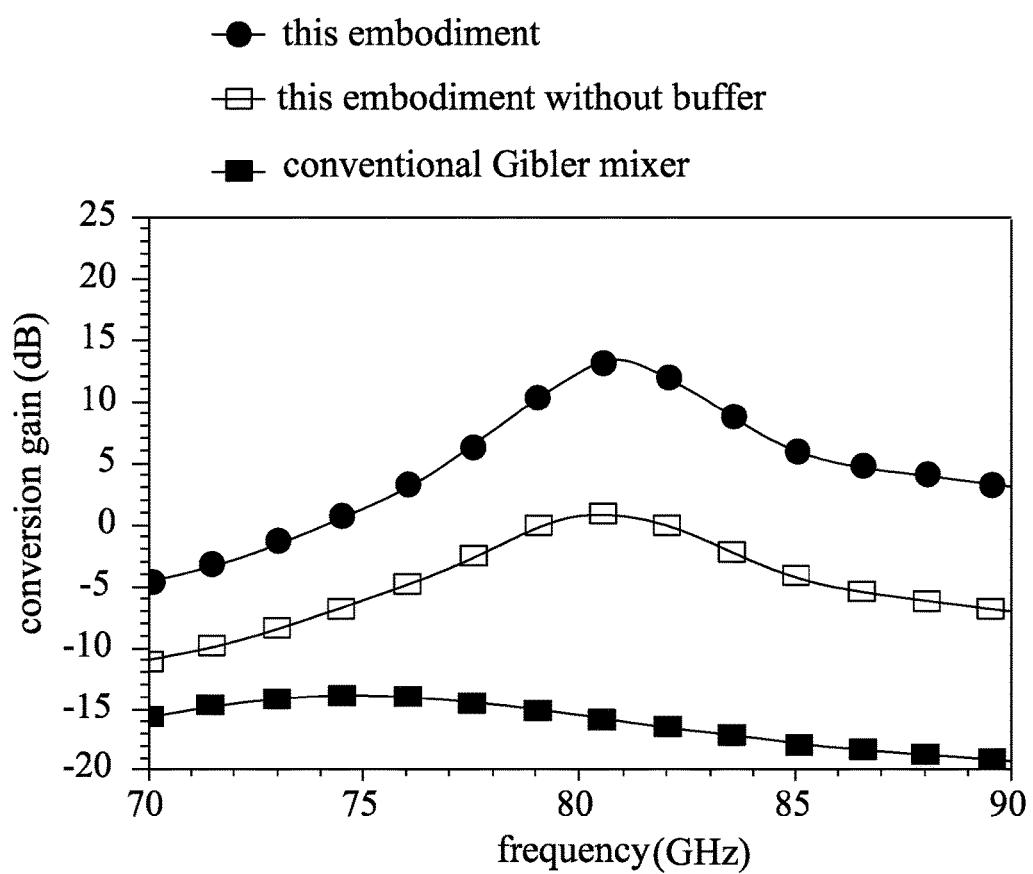
FIG. 3 is a plot illustrating conversion gain versus frequency characteristic in various conditions.

FIG. 3 illustrates conversion gain versus frequency characteristic in various conditions. Because the buffer 7 can reduce the loading effect from the differential to single-ended converter 8, it is known from FIG. 3 that the conversion gain is higher in this embodiment than in a condition without the buffer 7, and the conversion gain is higher in this embodiment without the buffer 7 than in the conventional Gilbert mixer. In other words, the gain boost unit 5 and the buffer 7 can enhance the conversion gain of this embodiment.

Figure 4A:
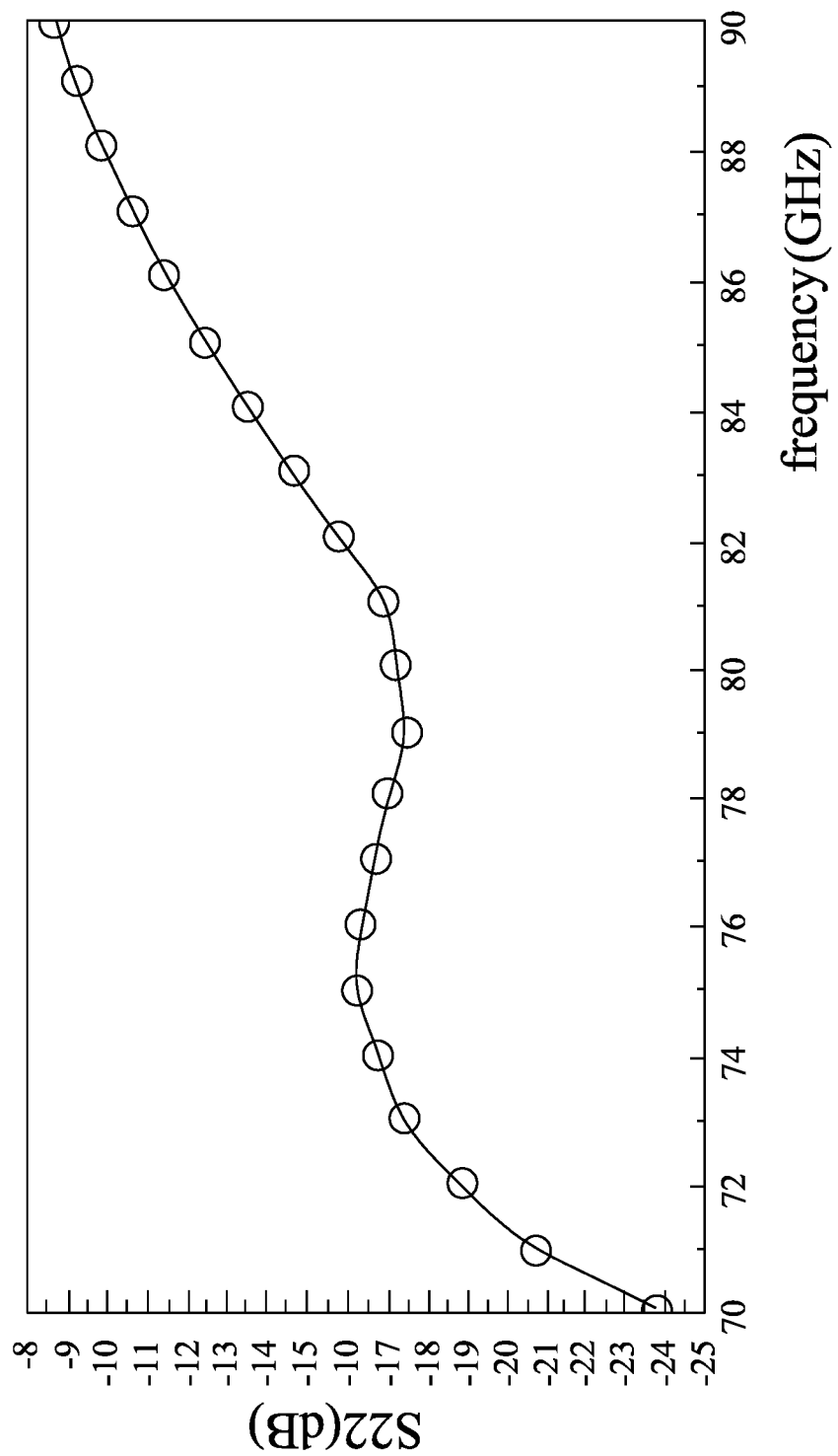
FIG. 4A is a plot illustrating reflection coefficient S22 versus frequency characteristic of the embodiment.
Figure 4B:
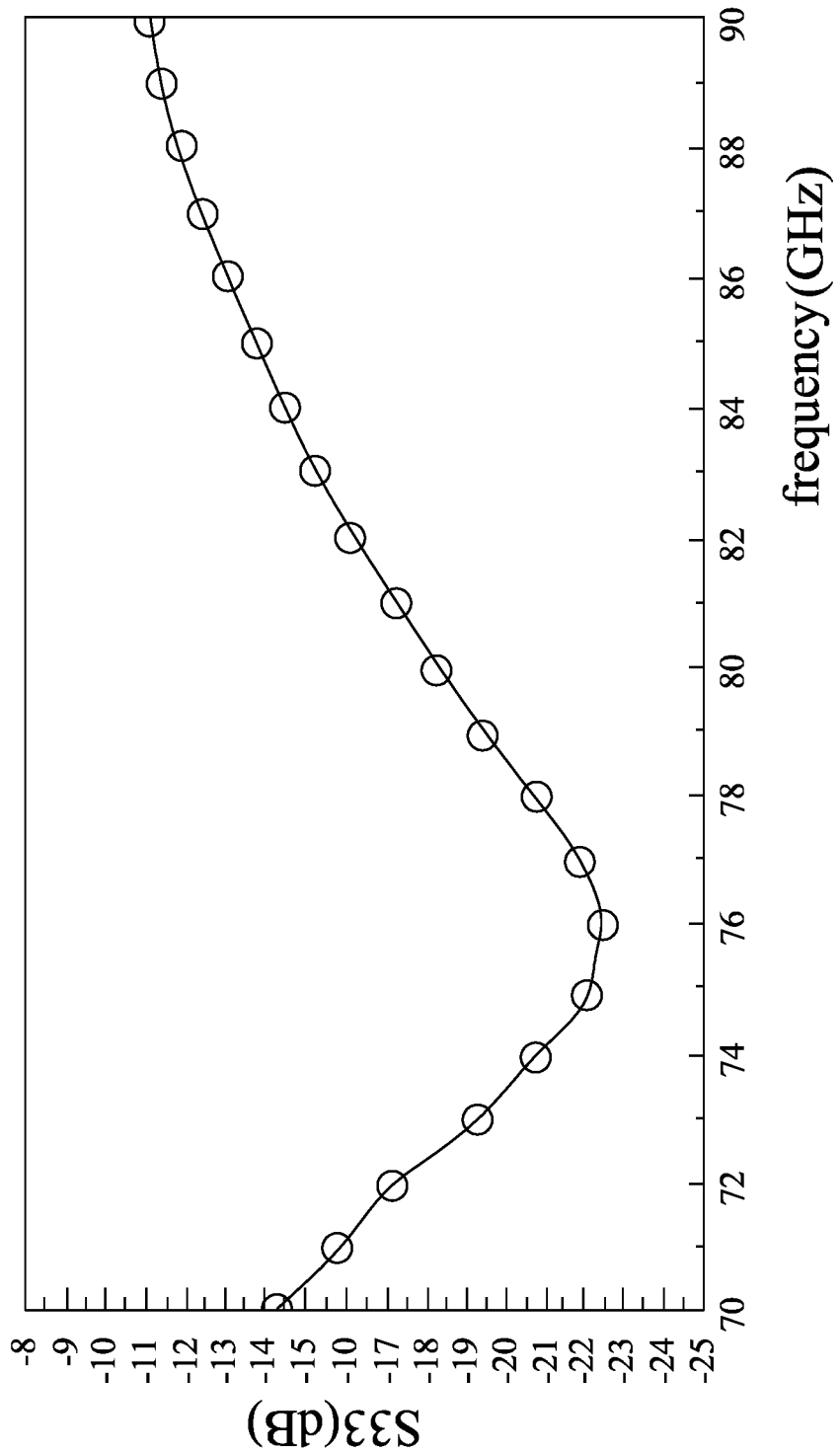
FIG. 4B is a plot illustrating reflection coefficient S33 versus frequency characteristic of the embodiment.

FIG. 4A illustrates reflection coefficient S22 versus frequency characteristic obtained from an input terminal of the single-ended to differential converter 3, at which the single-ended oscillatory voltage signal (LO) is received, and FIG. 4B illustrates reflection coefficient S33 versus frequency characteristic obtained from an output terminal of the differential to single-ended converter 8, at which the single-ended buffered voltage signal (RF) is outputted. It is known from FIGS. 4A and 4B that at 79 GHz, the reflection coefficients S22, S33 are respectively –17.5 dB and –19.5 dB. In other words, the mixer of this embodiment can achieve good energy transmission.

Figure 5:
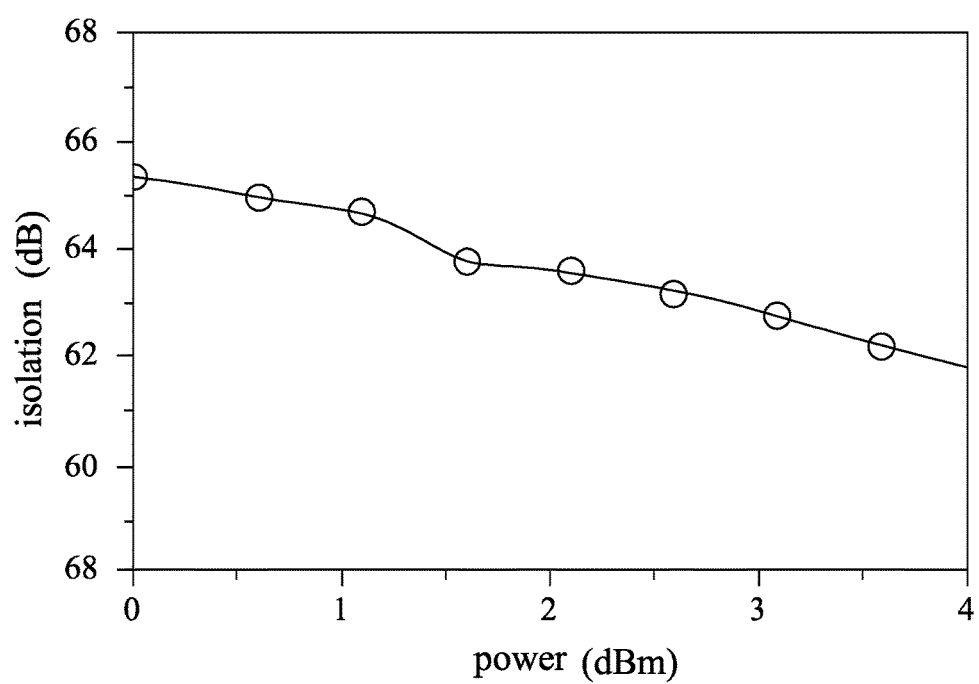
FIG. 5 is a plot illustrating isolation versus power characteristic of the embodiment.

FIG. 5 illustrates relationship between isolation between the input terminal of the single-ended to differential converter 3 and the output terminal of the differential to single-ended converter 8 versus power of the single-ended oscillatory voltage signal (LO). It is known from FIG. 5 that the isolation between the input terminal of the single-ended to differential converter 3 and the output terminal of the differential to single-ended converter 8 is good.

Figure 6:
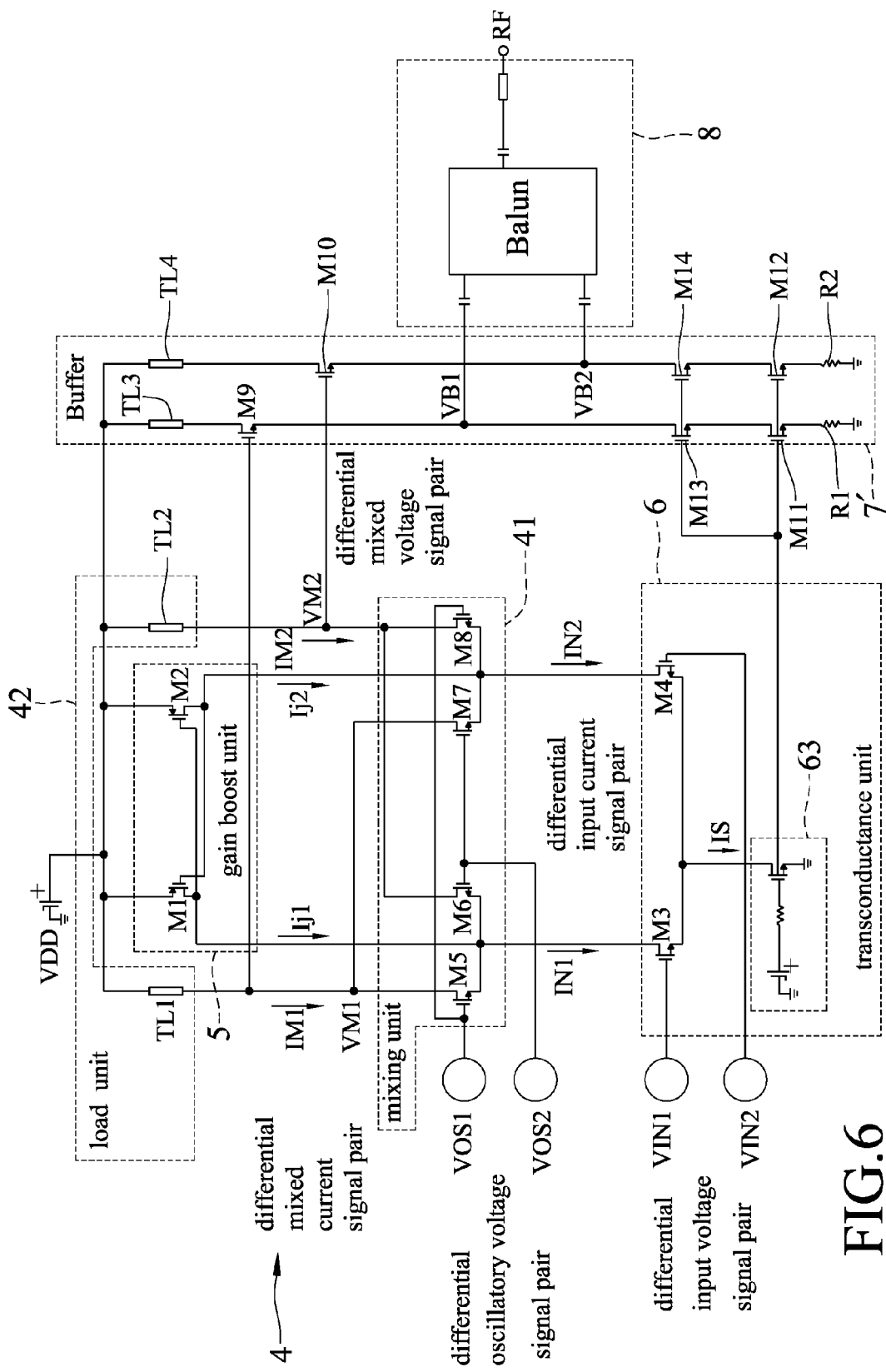
FIG. 6 is circuit block diagram illustrating a modification of the circuit shown in FIG. 2B.

FIG. 6 shows a circuit block diagram of a mixer similar to that shown in FIG. 2, and differs in that the mixer of FIG. 6 includes a buffer 7' instead of the buffer 7 as shown in FIG. 2. The buffer 7' includes a ninth transistor (M9), a tenth transistor (M10), an eleventh transistor (M11), a twelfth transistor (M12), a thirteenth transistor (M13), a fourteenth transistor (M14), a third inductive transmission line (TL3), a fourth inductive transmission line (TL4), a first resistor (R1) and a second resistor (R2).

The ninth transistor (M9) has a control terminal that is coupled to the second terminal of the first inductive transmission line (TL1) of the load unit 42 of the mixing module 4 for receiving the first mixed voltage signal (VM1) therefrom, a first terminal, and a second terminal that outputs the first buffered voltage signal (VB1).

The tenth transistor (M10) has a control terminal that is coupled to the second terminal of the second inductive transmission line (TL2) of the load unit 42 of the mixing module 4 for receiving the second mixed voltage signal (VM2) therefrom, a first terminal, and a second terminal that outputs the second buffered voltage signal (VB2).

The eleventh transistor (M11) has a first terminal, a second terminal, and a control terminal that is coupled to the current source 63 for receiving the bias voltage therefrom.

The twelfth transistor (M12) has a first terminal, a second terminal, and a control terminal that is coupled to the control terminal of the eleventh transistor (M11) and that receives the bias voltage.

The thirteenth transistor (M13) has a first terminal that is coupled to the second terminal of the ninth transistor (M9), a second terminal coupled to the first terminal of the eleventh transistor (M11), and a control terminal that is coupled to the current source 63 for receiving the bias voltage therefrom.

The fourteenth transistor (M14) has a first terminal that is coupled to the second terminal of the tenth transistor (M10), a second terminal coupled to the first terminal of the twelfth transistor (M12), and a control terminal that is coupled to the current source 63 for receiving the bias voltage therefrom.

The third inductive transmission line (TL3) has a first terminal that receives the supply voltage (VDD), and a second terminal that is coupled to the first terminal of the ninth transistor (M9).

The fourth inductive transmission line (TL4) has a first terminal that receives the supply voltage (VDD), and a second terminal that is coupled to the first terminal of the tenth transistor (M10).

The first resistor (R1) is coupled between the second terminal of the eleventh transistor (M11) and ground. The second resistor (R2) is coupled between the second terminal of the twelfth transistor (M12) and ground.

In such modification, the cascode-type current source is used instead of the common-source current source. Since the cascode-type current source may have greater output impedance, the gain of the buffer 7' is closer to 1 in comparison to the common-source current source, resulting in larger conversion gain of the entire mixer circuit.

In view of the above, the mixer of this embodiment can simultaneously achieve low power consumption and high conversion gain.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A mixer comprising:
    a transconductance unit receiving a differential input voltage signal pair having a predetermined input frequency, and converting the differential input voltage signal pair into a differential input current signal pair that includes a first input current signal and a second input current signal and that has the predetermined input frequency;
    a gain boost unit coupled to said transconductance unit, and generating a first auxiliary current signal that constitutes a portion of the first input current signal, and a second auxiliary current signal that constitutes a portion of the second input current signal;
    a mixing module receiving a differential oscillatory voltage signal pair that has a predetermined oscillatory frequency, and coupled to said transconductance unit for receiving a remaining portion of the first input current signal and a remaining portion of the second input current signal therefrom, said mixing module mixing the remaining portions of the first and second input current signals with the differential oscillatory voltage signal pair to generate a differential mixed voltage signal pair that has a mix frequency associated with the predetermined input frequency and the predetermined oscillatory frequency; and
    a buffer having:
        a transistor part that is coupled to said mixing module for receiving the differential mixed voltage signal pair therefrom, that has a pair of buffer output terminals, that has a parasitic capacitance at each of said buffer terminals, and that performs buffering on the differential mixed voltage signal pair to generate at said buffer output terminals a differential buffered voltage signal pair having the mix frequency; and
        an inductive part that is coupled to said transistor part, and that has predetermined inductances that cooperate with the parasitic capacitances at said buffer output terminals to form an LC tank circuit that reaches resonance to behave as an open circuit when operating at the mix frequency.

2. The mixer of claim 1, wherein said gain boost unit includes:
    a first transistor having a first terminal that receives a supply voltage, a second terminal that outputs the first auxiliary current signal, and a control terminal; and
    a second transistor having a first terminal that receives the supply voltage, a second terminal that is coupled to said control terminal of said first transistor and that outputs the second auxiliary current signal, and a control terminal that is coupled to said second terminal of said first transistor.

3. The mixer of claim 2, wherein the differential input voltage signal pair includes a first input voltage signal and a second input voltage signal, and said transconductance unit includes:
    a third transistor having a first terminal that is coupled to said second terminal of said first transistor and that outputs the first input current signal, a second terminal, and a control terminal that receives the first input voltage signal;
    a fourth transistor having a first terminal that is coupled to said second terminal of said second transistor and that outputs the second input current signal, a second terminal that is coupled to said second terminal of said third transistor, and a control terminal that receives the second input voltage signal; and
    a current source coupled to said second terminal of said third transistor for providing a bias current thereto.

4. The mixer of claim 3, wherein said mixing module includes:
    a mixing unit receiving the differential oscillatory voltage signal pair, and coupled to said first terminals of said third and fourth transistors for receiving the remaining portions of the first and second input current signals respectively therefrom, said mixing unit mixing the remaining portions of the first and second input current signals with the differential oscillatory voltage signal pair to generate a differential mixed current signal pair; and
    a load unit coupled to said mixing unit for receiving the differential mixed current signal pair therefrom, and converting the differential mixed current signal pair into the differential mixed voltage signal pair.

5. The mixer of claim 4, wherein the differential mixed current signal pair includes a first mixed current signal and a second mixed current signal, the differential oscillatory voltage signal pair includes a first oscillatory voltage signal and a second oscillatory voltage signal, and said mixing unit includes:
    a fifth transistor having a first terminal, a second terminal that is coupled to said first terminal of said third transistor, and a control terminal that receives the first oscillatory voltage signal;
    a sixth transistor having a first terminal, a second terminal that is coupled to said second terminal of said fifth transistor, and a control terminal that receives the second oscillatory voltage signal, said sixth transistor cooperating with said fifth transistor to receive the remaining portion of the first input current signal from said third transistor;
    a seventh transistor having a first terminal that is coupled to said first terminal of said fifth transistor, a second terminal that is coupled to said first terminal of said fourth transistor, and a control terminal that receives the second oscillatory voltage signal, said seventh transistor cooperating with said fifth transistor to output the first mixed current signal; and
    an eighth transistor having a first terminal that is coupled to said first terminal of said sixth transistor, a second terminal that is coupled to said second terminal of said seventh transistor, and a control terminal that receives the first oscillatory voltage signal, said eighth transistor cooperating with said seventh transistor to receive the remaining portion of the second input current signal from said fourth transistor, and cooperating with said sixth transistor to output the second mixed current signal.

6. The mixer of claim 5, wherein the differential mixed voltage signal pair includes a first mixed voltage signal and a second mixed voltage signal, and said load unit includes:
- a first inductive transmission line having a first terminal that receives the supply voltage, and a second terminal that is coupled to said first terminal of said fifth transistor for receiving the first mixed current signal therefrom and that outputs the first mixed voltage signal; and
- a second inductive transmission line having a first terminal that receives the supply voltage, and a second terminal that is coupled to said first terminal of said sixth transistor for receiving the second mixed current signal therefrom and that outputs the second mixed voltage signal.

7. The mixer of claim 6, wherein the differential mixed voltage signal pair includes a first mixed voltage signal and a second mixed voltage signal each having the mix frequency, the differential buffered voltage signal pair includes a first buffered voltage signal and a second buffered voltage signal each having the mix frequency, said buffer output terminals include a first buffer output terminal and a second buffer output terminal each having the parasitic capacitance thereat, and said buffer includes:
- a ninth transistor having a control terminal that is coupled to said mixing module for receiving the first mixed voltage signal therefrom, a first terminal, and a second terminal that serves as said first buffer output terminal at which the first buffered voltage signal is outputted;
- a tenth transistor having a control terminal that is coupled to said mixing module for receiving the second mixed voltage signal therefrom, a first terminal, and a second terminal that serves as said second buffer output terminal at which the second buffered voltage signal is outputted;
- an eleventh transistor having a first terminal that is coupled to said second terminal of said ninth transistor, a second terminal, and a control terminal that receives a bias voltage;
- a twelfth transistor having a first terminal that is coupled to said second terminal of said tenth transistor, a second terminal, and a control terminal that receives the bias voltage;
- a third inductive transmission line having a first terminal that receives a supply voltage, and a second terminal that is coupled to said first terminal of said ninth transistor, and having a predetermined inductance that cooperates with the parasitic capacitance at said first buffer output terminal to form a first LC tank circuit that reaches resonance to behave as an open circuit when operating at the mix frequency;
- a fourth inductive transmission line having a first terminal that receives the supply voltage, and a second terminal that is coupled to said first terminal of said tenth transistor, and having a predetermined inductance that cooperates with the parasitic capacitance at said second buffer output terminal to form a second LC tank circuit that reaches resonance to behave as an open circuit when operating at the mix frequency;
- a first resistor coupled between said second terminal of said eleventh transistor and ground; and
- a second resistor coupled between said second terminal of said twelfth transistor and ground.

8. The mixer of claim 6, wherein the differential mixed voltage signal pair includes a first mixed voltage signal and a second mixed voltage signal each having the mix frequency, the differential buffered voltage signal pair includes a first buffered voltage signal and a second buffered voltage signal each having the mix frequency, said buffer output terminals include a first buffer output terminal and a second buffer output terminal each having the parasitic capacitance thereat, and said buffer includes:
- a ninth transistor having a control terminal that is coupled to said mixing module for receiving the first mixed voltage signal therefrom, a first terminal, and a second terminal that serves as said first buffer output terminal at which the first buffered voltage signal is outputted;
- a tenth transistor having a control terminal that is coupled to said mixing module for receiving the second mixed voltage signal therefrom, a first terminal, and a second terminal that serves as said second buffer output terminal at which the second buffered voltage signal is outputted;
- an eleventh transistor having a first terminal, a second terminal, and a control terminal that receives a bias voltage;
- a twelfth transistor having a first terminal, a second terminal, and a control terminal that receives the bias voltage;
- a thirteenth transistor having a first terminal that is coupled to said second terminal of said ninth transistor, a second terminal coupled to said first terminal of said eleventh transistor, and a control terminal that receives the bias voltage;
- a fourteenth transistor having a first terminal that is coupled to said second terminal of said tenth transistor, a second terminal coupled to said first terminal of said twelfth transistor, and a control terminal that receives the bias voltage;
- a third inductive transmission line having a first terminal that receives a supply voltage, and a second terminal that is coupled to said first terminal of said ninth transistor, and having a predetermined inductance that cooperates with the parasitic capacitance at said first buffer output terminal to form a first LC tank circuit that reaches resonance to behave as an open circuit when operating at the mix frequency;
- a fourth inductive transmission line having a first terminal that receives the supply voltage, and a second terminal that is coupled to said first terminal of said tenth transistor, and having a predetermined inductance that cooperates with the parasitic capacitance at said second buffer output terminal to form a second LC tank circuit that reaches resonance to behave as an open circuit when operating at the mix frequency;
- a first resistor coupled between said second terminal of said eleventh transistor and ground; and
- a second resistor coupled between said second terminal of said twelfth transistor and ground.

9. The mixer of claim 6, further comprising:
- a differential to single-ended converter coupled to said buffer for receiving the differential buffered voltage signal pair therefrom, and converting the differential buffered voltage signal pair into a single-ended buffered voltage signal.

10. The mixer of claim 1, further comprising:
- a single-ended to differential converter coupled to said mixing module, receiving a single-ended oscillatory voltage signal, and converting the single-ended oscillatory voltage signal into the differential oscillatory voltage signal pair for said mixing module.

11. The mixer of claim 1, wherein the differential mixed voltage signal pair includes a first mixed voltage signal and a second mixed voltage signal each having the mix frequency, the differential buffered voltage signal pair includes a first buffered voltage signal and a second buffered voltage signal each having the mix frequency, said buffer output terminals include a first buffer output terminal and a second buffer output terminal each having the parasitic capacitance thereat, and said buffer includes:
- a ninth transistor having a control terminal that is coupled to said mixing module for receiving the first mixed voltage signal therefrom, a first terminal, and a second terminal that serves as said first buffer output terminal at which the first buffered voltage signal is outputted;
- a tenth transistor having a control terminal that is coupled to said mixing module for receiving the second mixed voltage signal therefrom, a first terminal, and a second terminal that serves as said second buffer output terminal at which the second buffered voltage signal is outputted;
- an eleventh transistor having a first terminal that is coupled to said second terminal of said ninth transistor, a second terminal, and a control terminal that receives a bias voltage;
- a twelfth transistor having a first terminal that is coupled to said second terminal of said tenth transistor, a second terminal, and a control terminal that receives the bias voltage;
- a third inductive transmission line having a first terminal that receives a supply voltage, and a second terminal that is coupled to said first terminal of said ninth transistor, and having a predetermined inductance that cooperates with the parasitic capacitance at said first buffer output terminal to form a first LC tank circuit that reaches resonance to behave as an open circuit when operating at the mix frequency;
- a fourth inductive transmission line having a first terminal that receives the supply voltage, and a second terminal that is coupled to said first terminal of said tenth transistor, and having a predetermined inductance that cooperates with the parasitic capacitance at said second buffer output terminal to form a second LC tank circuit that reaches resonance to behave as an open circuit when operating at the mix frequency;
- a first resistor coupled between said second terminal of said eleventh transistor and ground; and
- a second resistor coupled between said second terminal of said twelfth transistor and ground.

12. The mixer of claim 11, satisfying a first relationship and a second relationship, wherein:
the first relationship is that a ratio of $R_{1,2}$ to $(L_{3,4}g_{m9,10})/C_{ds9,10}$ ranges between 0.9 and 1.1; and
the second relationship is that, at the frequency of the differential buffered voltage signal pair, a ratio of $1/s[C_{ds11,12}/(g_{m11,12}R_{1,2})]$ to $-sL_{3,4}$ ranges between 0.9 and 1.1,
where $g_{m9,10}$ represents a transconductance of each of said ninth and tenth transistors, $g_{m11,12}$ represents a transconductance of each of said eleventh and twelfth transistors, $R_{1,2}$ represents a resistance of each of said first and second resistors, $C_{ds11,12}$ represents a parasitic capacitance between said first and second terminals of each of said eleventh and twelfth transistors, $C_{ds9,10}$ represents a parasitic capacitance between said first and second terminals of each of said ninth and tenth transistors, and $L_{3,4}$ represents an inductance of each of said third and fourth inductive transmission lines.

13. The mixer of claim 1, wherein the differential mixed voltage signal pair includes a first mixed voltage signal and a second mixed voltage signal each having the mix frequency, the differential buffered voltage signal pair includes a first buffered voltage signal and a second buffered voltage signal each having the mix frequency, said buffer output terminals include a first buffer output terminal and a second buffer output terminal each having the parasitic capacitance thereat, and said buffer includes:
- a ninth transistor having a control terminal that is coupled to said mixing module for receiving the first mixed voltage signal therefrom, a first terminal, and a second terminal that serves as said first buffer output terminal at which the first buffered voltage signal is outputted;
- a tenth transistor having a control terminal that is coupled to said mixing module for receiving the second mixed voltage signal therefrom, a first terminal, and a second terminal that serves as said second buffer output terminal at which the second buffered voltage signal is outputted;
- an eleventh transistor having a first terminal, a second terminal, and a control terminal that receives a bias voltage;
- a twelfth transistor having a first terminal, a second terminal, and a control terminal that receives the bias voltage;
- a thirteenth transistor having a first terminal that is coupled to said second terminal of said ninth transistor, a second terminal coupled to said first terminal of said eleventh transistor, and a control terminal that receives the bias voltage;
- a fourteenth transistor having a first terminal that is coupled to said second terminal of said tenth transistor, a second terminal coupled to said first terminal of said twelfth transistor, and a control terminal that receives the bias voltage;
- a third inductive transmission line having a first terminal that receives a supply voltage, and a second terminal that is coupled to said first terminal of said ninth transistor, and having a predetermined inductance that cooperates with the parasitic capacitance at said first buffer output terminal to form a first LC tank circuit that reaches resonance to behave as an open circuit when operating at the mix frequency;
- a fourth inductive transmission line having a first terminal that receives the supply voltage, and a second terminal that is coupled to said first terminal of said tenth transistor, and having a predetermined inductance that cooperates with the parasitic capacitance at said second buffer output terminal to form a second LC tank circuit that reaches resonance to behave as an open circuit when operating at the mix frequency;
- a first resistor coupled between said second terminal of said eleventh transistor and ground; and
- a second resistor coupled between said second terminal of said twelfth transistor and ground.

14. The mixer of claim 13, satisfying a first relationship and a second relationship, wherein:
the first relationship is that a ratio of $R_{1,2}$ to $(L_{3,4}g_{m9,10})/C_{ds9,10}$ ranges between 0.9 and 1.1; and
the second relationship is that, at the frequency of the differential buffered voltage signal pair, a ratio of $1/s[C_{ds11,12}/(g_{m11,12}R_{1,2})]$ to $-sL_{3,4}$ ranges between 0.9 and 1.1,
where $g_{m9,10}$ represents a transconductance of each of said ninth and tenth transistors, $g_{m11,12}$ represents a transconductance of each of said eleventh and twelfth transistors, $R_{1,2}$ represents a resistance of each of said first and second resistors, $C_{ds11,12}$ represents a parasitic capacitance between said first and second terminals of each of said eleventh and twelfth transistors, $C_{ds9,10}$ represents a parasitic capacitance between said first and second terminals of each of said ninth and tenth transistors, and $L_{3,4}$ represents an inductance of each of said third and fourth inductive transmission lines.

* * * * *